(12) United States Patent  
Chiu

(10) Patent No.: US 7,782,597 B2  
(45) Date of Patent: Aug. 24, 2010

(54) WATERPROOF PANEL

(75) Inventor: Ming-Chien Chiu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 173 days.

(21) Appl. No.: 12/184,259

(22) Filed: Aug. 1, 2008

(65) Prior Publication Data

US 2009/0052143 A1    Feb. 26, 2009

(30) Foreign Application Priority Data

Aug. 24, 2007    (CN) .................. 2007 1 0201450

(51) Int. Cl.
*H05K 7/20* (2006.01)
*A47B 43/00* (2006.01)

(52) U.S. Cl. ............... 361/679.01; 361/679.46; 361/679.49; 361/690; 361/724; 312/223.1; 312/223.2; 312/223.3; 312/100; 312/101; 174/16.1; 174/17 VA; 174/17 R; 174/50; 174/520

(58) Field of Classification Search ............ 361/679.01, 361/679.46, 679.47, 679.49, 690–697, 719–727; 454/184, 193; 312/100, 101, 223.1, 223.2, 312/223.3, 257.1, 265.1, 265.2, 165.3, 296, 312/236; 174/16.1, 17 VA, 17 R, 50, 67, 174/520, 522

See application file for complete search history.

(56) References Cited

U.S. PATENT DOCUMENTS

| 3,900,700 | A  | * | 8/1975  | Gaudet ..................... 174/16.1 |
| 5,697,840 | A  | * | 12/1997 | Bainbridge et al. ......... 454/184 |
| 6,101,090 | A  |   | 8/2000  | Gates et al. |
| 6,201,694 | B1 | * | 3/2001  | Turunen .................... 361/695 |
| 6,365,826 | B1 | * | 4/2002  | Stendardo et al. ....... 174/17 VA |
| 6,843,543 | B2 | * | 1/2005  | Ramesh ..................... 312/100 |
| 6,889,752 | B2 | * | 5/2005  | Stoller ........................ 165/47 |

* cited by examiner

*Primary Examiner*—Michael V Datskovskiy
(74) *Attorney, Agent, or Firm*—Frank R. Niranjan

(57) ABSTRACT

A waterproof panel comprises a front wall, a back wall, a front baffle assembly and a back baffle. A cavity is defined between the front wall and the back wall, the front baffle assembly and the back baffle are received in the cavity. The front wall defines a first hole array and a second hole array, the back wall defines a third hole array in same height with the second hole array. The front baffle assembly fixed on one side of the second hole array near the third hole array comprises a main baffle. The back baffle fixed on one side of the third hole array near the second hole array is on one side of the main baffle near the second hole array. The back wall comprises a plurality of protruding strips, which can rebound water entering through the third hole array back.

14 Claims, 5 Drawing Sheets

WATERPROOF PANEL

BACKGROUND

1. Field of the Invention

The present invention relates to waterproof panels, particularly to a waterproof panel used in an outdoor cabinet for housing electronic equipment.

2. Description of Related Art

Generally, electronic equipment utilized outdoors is placed in a waterproof cabinet. An issue that arises with such a cabinet is, how to most effectively cool the electronic equipment while maintaining the waterproof features of the cabinet.

One approach is to provide fans in the cabinet in combination with a heat exchanger located near the electronic equipment. Although such an approach is effective, the fans employed by the heat exchanger undoubtedly add considerable expense to the cost of the cabinet. Thus, proposals have been made to rely on natural convection in combination with a heat exchanger and/or cooling fins provided in a ventilated portion of the cabinet, however, the heat exchanger and the cooling fins also increase the cost of the cabinet.

It is desirable to provide a waterproof cabinet which efficiently and economically cools electronic components housed therein.

SUMMARY

According to an exemplary embodiment of the present invention, a waterproof panel comprises a front wall, a back wall fixed to the front wall, a front baffle assembly and a back baffle. The front wall defines a first hole array and a second hole array, the first hole array is near a lower end of the front wall, the second hole array is near an upper end of the front wall. A cavity is defined between the front wall and the back wall. A third hole array defined in the back wall is not aligned with but at the same height as the second hole array.

The front baffle assembly is fixed on one side of the second hole array and near the third hole array and extends to the cavity, the front baffle assembly comprises a main baffle comprising a first portion fixed on the front wall and a second portion inclining towards the second hole array. The back baffle is fixed on one side of the third hole array and near the second hole array and extends to the cavity, the back baffle is disposed on one side of the main baffle near the second hole array. The back wall comprises a plurality of protruding strips, which can rebound water entering through the third hole array back.

Other advantages and novel features will become more apparent from the following detailed description when taken in conjunction with the accompanying drawings, in which:

DETAILED DESCRIPTION OF THE EMBODIMENTS

Figure 1:
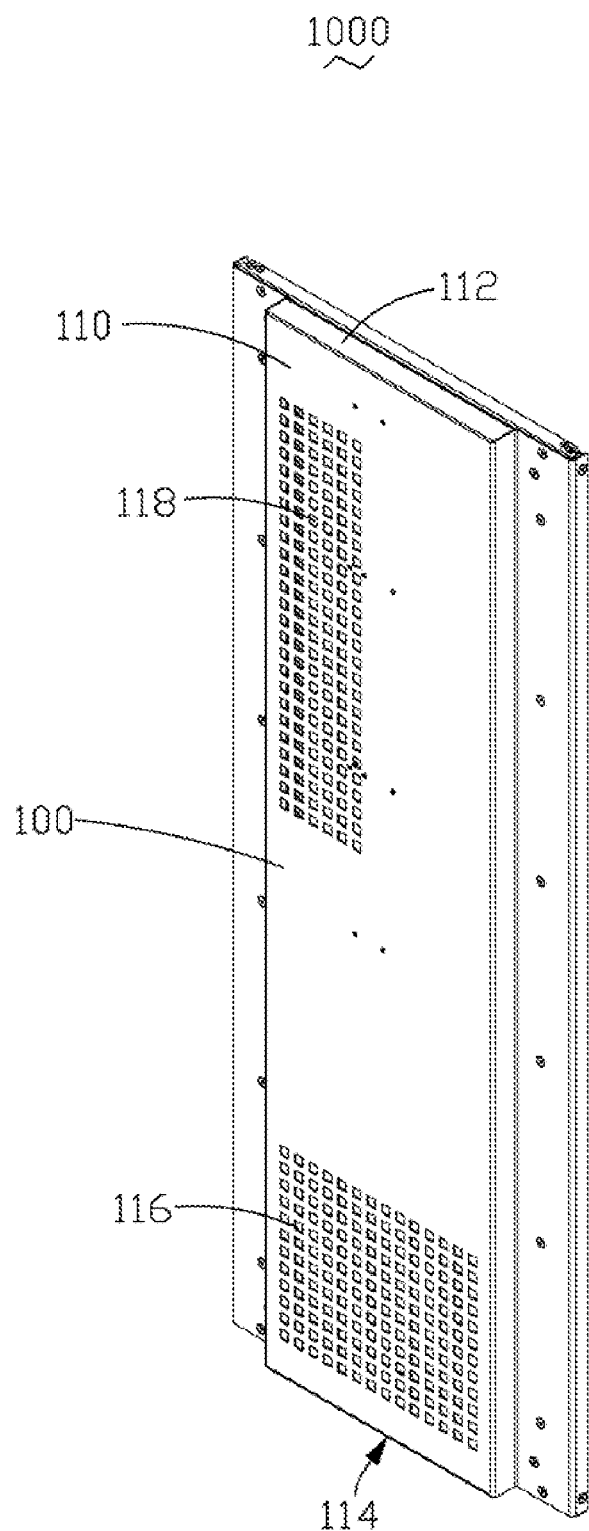
FIG. 1 is a front view of a waterproof panel in accordance with an exemplary embodiment.
Figure 2:
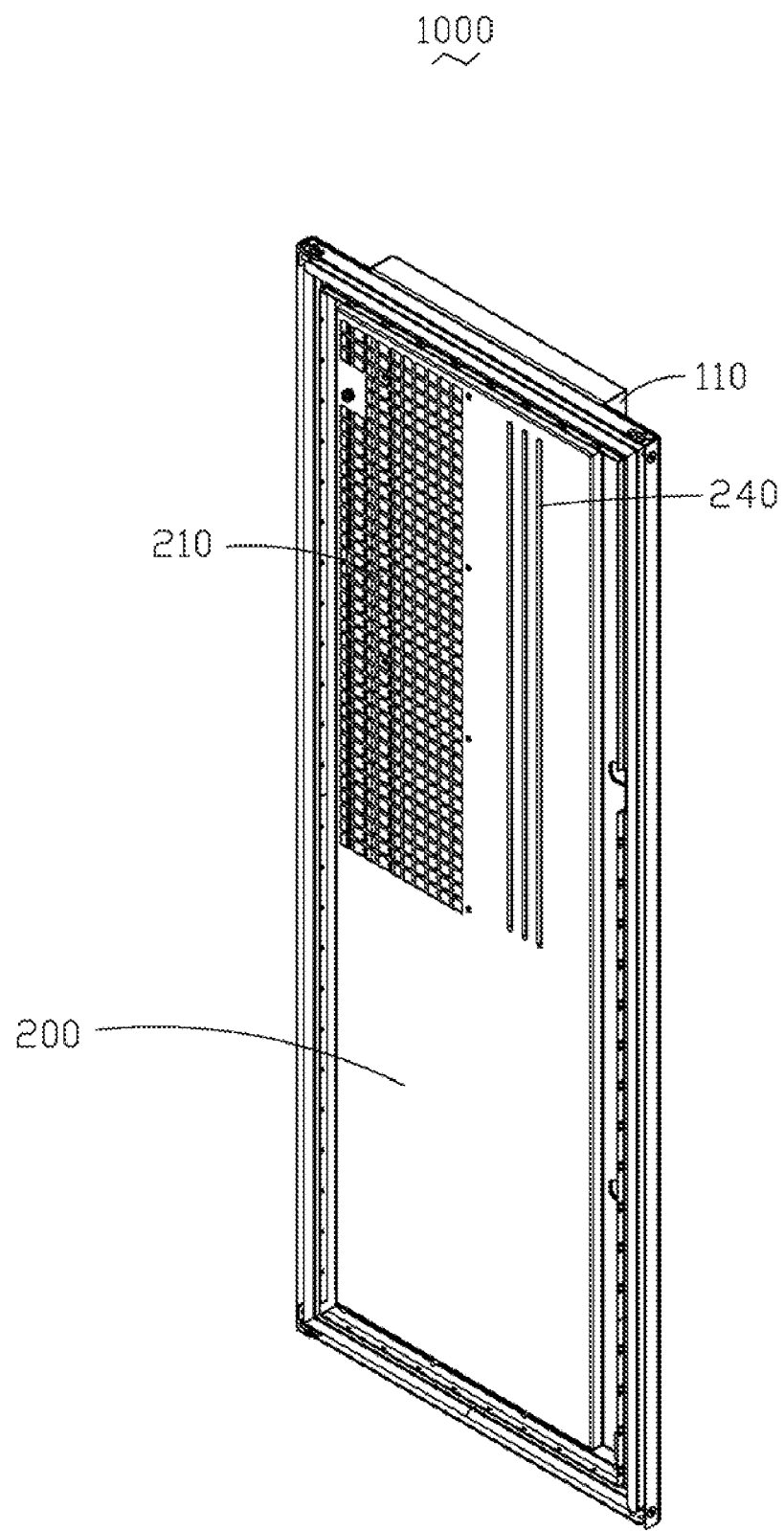
FIG. 2 is a rear view of the waterproof panel of FIG. 1.

Referring to FIG. 1 and FIG. 2, a front view and a back view of a waterproof panel 1000 used as a waterproof door or a waterproof wall of a waterproof cabinet having a cabinet body defining a cabinet space therein for accommodating electronic equipment are respectively shown. The cabinet body includes an outdoor side. The waterproof panel attached to the outdoor side comprises a standing front wall 100 (shown in FIG. 1) and a back wall 200 (shown in FIG. 2) fixed on the front wall 100 in parallel.

Figure 3:
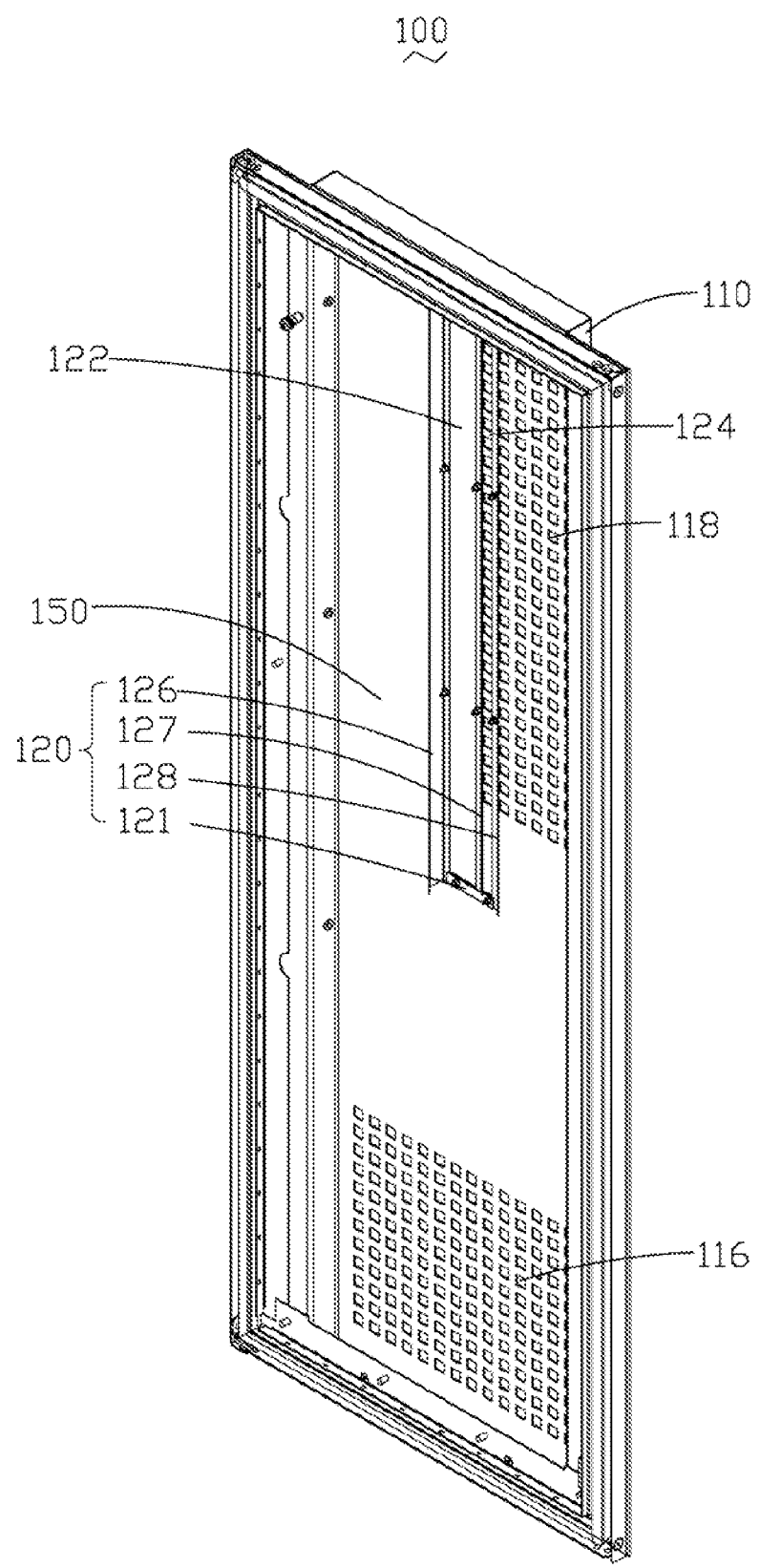
FIG. 3 is a rear view of a front wall of the waterproof panel of FIG. 1.

Referring to FIG. 3, the front wall comprises a rectangular protrusion 110 extending along a direction away from the back wall 200, thus a cavity 150, as an air circulation, is defined between the front wall 100 and the back wall 200. An upper end 112 and a lower end 114 of the protrusion 110 are respectively flush with an upper end and a lower end of the front wall 100. The protrusion 110 defines a first hole array 116 including a plurality of air holes and a second hole array 118 including a plurality of air holes. In this embodiment, the air holes of the first and second hole arrays 116, 118 are rectangular. In other embodiments, the air holes of the first and second hole arrays 116, 118 can have other shapes such as circular.

The air holes of the first hole array 116 are defined near the lower end 114 of the protrusion 110. The first hole array 166 can improve air flow within the cavity 150 and aids in heat dissipation of the lower part of the back wall 200. Advantageously, not a lot of water can accumulate in the cavity 150 as it will drain through the air holes of the first hole array 166. In other embodiments, an opening can be employed instead of the first hole array 166. The second hole array 118 is defined near an upper corner of the protrusion 110. The front wall 100 further comprises a front baffle assembly 120. The front baffle assembly 120 is fixed on the front wall 100 extending toward the back wall 200 in the cavity 150.

Figure 4:
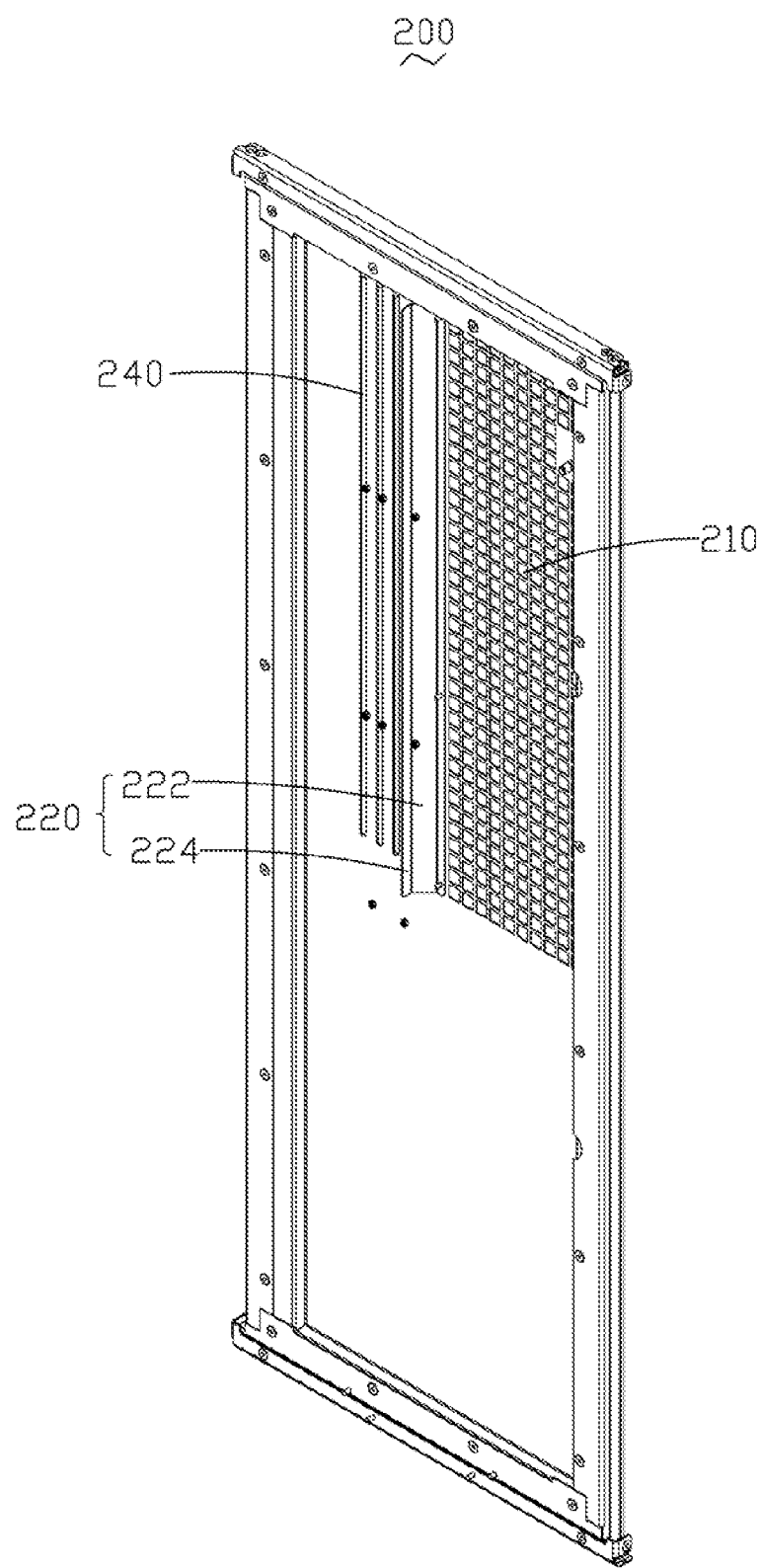
FIG. 4 is a perspective view of a back wall of the waterproof panel of FIG. 1.

Referring to FIG. 4, the back wall 200 defines a third hole array 210 including a plurality of air holes. In this embodiment, the air holes of the third hole array 210 are rectangular. In other embodiments, the air holes of the third hole array 210 can have other shapes. The third hole array 210 is near an upper end of the back wall 200 and are not aligned with but at the same height as the second hole array 118 of the front wall 100. The back wall 200 also comprises a back baffle assembly 220. The back baffle assembly 220 is fixed on the back wall 200 extending toward the front wall 100 in the cavity 150.

Figure 5:
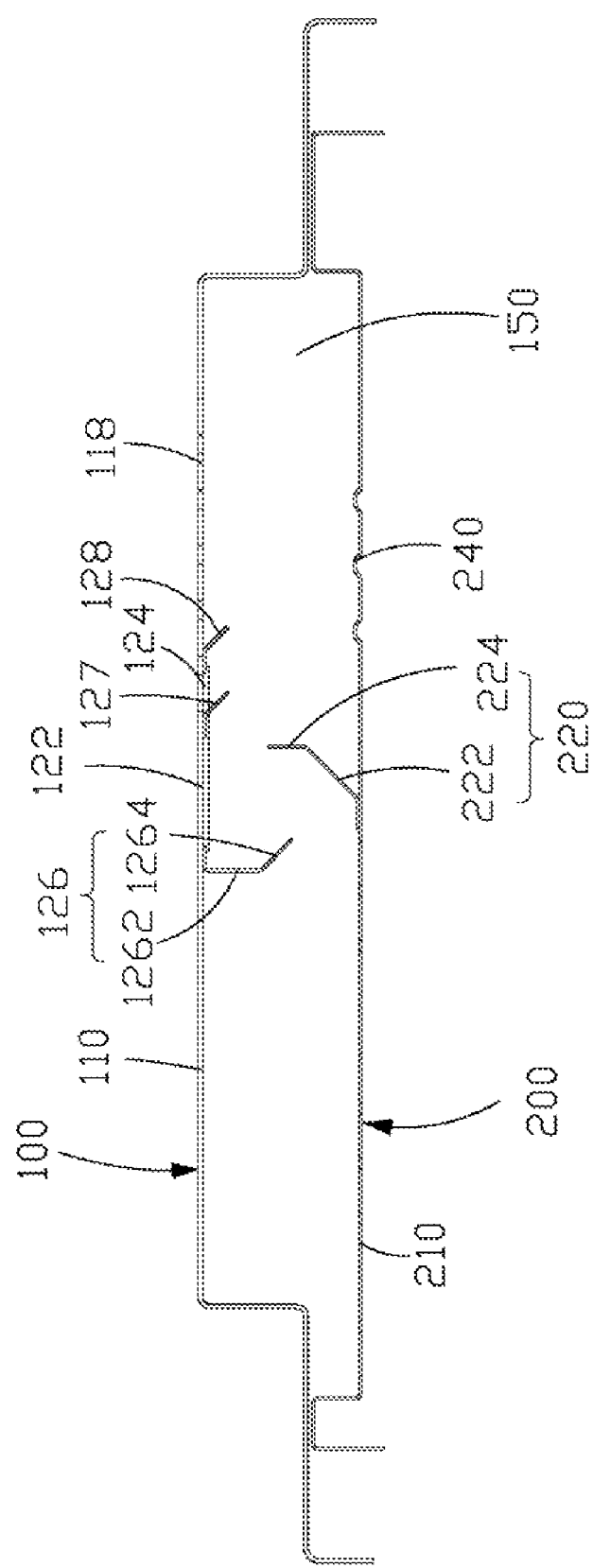
FIG. 5 is a cross-sectional schematic view of the waterproof panel of FIG. 1.

Referring to FIG. 3 and FIG. 5, the front baffle assembly 120 comprises a frame 121 fixed on the front wall 100, the frame 121 is on one side of the second hole array 118 and near the third hole array 210. A length of the frame 121 in is longer than the second hole array 118. The distance between the frame 121 and the upper end 112 of the protrusion 110 is less than the distance between the second hole array 118 and the upper end 112 of the protrusion 110. In this embodiment, a part of the frame 121 overlaps a portion of the second hole array 118.

The frame 121 defines two rectangular openings 122, 124. In this embodiment, the opening 124 encompasses the overlapped portion of the second hole array 118.

The front baffle assembly 120 comprises a main baffle 126, a first auxiliary baffle 127, and a second auxiliary baffle 128. In this embodiment, the auxiliary baffles 127, 128 are formed on the frame. The length of the baffles 126, 127, 128 are not less than that of the second hole array 118. The main baffle 126 comprises a first portion 1262 vertically connected to the frame 121, and a second portion 1264 extending from an end of the first portion 1262 away from the frame 121. The first portion 1262 is vertical to the front wall 100. The first portion 1262 is located on one side of the opening 122 away from the second hole array 118, the second portion 1264 inclines towards the second hole group 118, an angle between the second portion 1264 and the back wall 200 is approximately 45 degrees. The first auxiliary baffle 127 is disposed between the two openings 122, 124. The second auxiliary baffle 128 is located on one side of the opening 124 away from the first auxiliary baffle 127. The first auxiliary baffle 127 and the second auxiliary baffle 128 incline towards the same direction as that of the second portion 1264. The first and second auxiliary baffles 127, 128 can prevent water flowing in the cavity 150 from the opening 124 into a space between the main baffle 126 and the back baffle 220.

The back baffle 220 opposite to the front baffle assembly 120 is configured between the main baffle 126 and the first auxiliary baffle 127. The back baffle 220 comprises a first portion 222 connected to the back wall 200 and a second portion 224 extending from an end of the first portion 222 away from the back wall 200. The first portion 222 is located on one side of the third hole array 210 near the second hole array 118, and inclines towards the second hole array 118, an angle between the first portion 222 and the back wall 200 is substantially 45 degrees. The second portion 224 is in parallel with the first portion 1262 of the main baffle 126. A free end of the second portion 1264 of the main baffle 126, a free end of the second portion 224 of the back baffle 220 and a free end of the first auxiliary baffle 127 are arrayed in a straight line.

The back wall 200 comprises a plurality of protruding strips 240 integrally formed with the back wall 200 and protruding to the cavity 150. The protruding strips 240 are near the back baffle 220 and corresponding to the second hole array 118. The length of the protruding strips are not less than that of second hole array 118. In this embodiment, the protruding strips 240 parallel with the back baffle 220 are semicircular column-shaped.

Referring to FIG. 3 and FIG. 5, in actual application of the waterproof panel 1000, heat generated by electronic devices received in the cavity 150 can flow through the first hole array 116, the second hole array 118, the third hole array 210 and be vented outside.

During rain or other event, water or water drops may enter the cavity 150 through the second hole array 118. If the back wall 200 has no the protruding strips 240, the water or water drops would be rebounded by the back wall 200 and hit onto the front wall 100 between the main baffle 126 and the first auxiliary baffle 127, then, the water would be rebounded secondly and hit onto the third hole array 210 and ultimately flow into the waterproof cabinet. But the protruding strips 240 can change the rebounded direction of the water or water drops so that the water would instead hit onto the back wall 200 due to the semicircular column-shaped of the protruding strips 240. Thus, the water hitting onto the protruding strips 240 will be rebounded back to the third hole array 210, and can not flow into the waterproof cabinet. Thus, all of the water entering the cavity 150 through the second hole array 118 will be blocked by the main baffle 126, the back baffle 220, the first auxiliary baffle 127 and the second auxiliary baffle 128, then drain through the first hole array 116.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A waterproof panel, comprising:
    a front wall defining a first hole array and a second hole array, the first hole array being defined near a lower end of the front wall, the second hole array being defined near an upper end of the front wall;
    a back wall fixed to the front wall, the back wall defining a third hole array not aligned with but at the same height as the second hole array, and a cavity being defined between the front wall and the back wall;
    a front baffle assembly fixed on one side of the second hole array and near the third hole array and extending to the cavity, the front baffle assembly comprising a main baffle comprising a first portion fixed on the front wall and a second portion inclining towards the second hole array; and
    a back baffle fixed on one side of the third hole array and near the second hole array and extending to the cavity, the back baffle disposed on one side of the main baffle near the second hole array.

2. The waterproof panel as claimed in claim 1, wherein the first hole array, the second hole array and the third hole array are respectively composed of a plurality of holes.

3. The waterproof panel as claimed in claim 1, wherein the first portion of the main baffle is vertical to the front wall.

4. The waterproof panel as claimed in claim 3, wherein length of the main baffle and the back baffle are not less than that of the second hole array.

5. The waterproof panel as claimed in claim 1, wherein the front baffle assembly also comprises at least one auxiliary baffle disposed on one side of the main baffle and near the second hole array.

6. The waterproof panel as claimed in claim 5, wherein the front baffle assembly comprises a frame defining at least one opening, and one part of the frame covers over the second hole array, the auxiliary baffles are formed on the frame.

7. The waterproof panel as claimed in claim 5, wherein the auxiliary baffles incline towards the same direction as the second portion of the main baffle.

8. The waterproof panel as claimed in claim 7, wherein an angle between the second portion of the main baffle and the back wall is approximately 45 degrees.

9. The waterproof panel as claimed in claim 1, wherein the back baffle comprises a first portion fixed on the back wall and inclining towards the second hole array.

10. The waterproof panel as claimed in claim 9, wherein the back baffle also comprises a second portion extending from the end of the first portion away from the back wall, the second portion is vertical to the back wall.

11. The waterproof panel as claimed in claim 1, wherein the back wall comprises a plurality of protruding strips corresponding to the second hole array.

12. The waterproof panel as claimed in claim 11, wherein the length of the protruding strips are not less than that of second hole array.

13. The waterproof panel as claimed in claim 11, wherein the protruding strips are in parallel with the back baffle.

14. The waterproof panel as claimed in claim 11, wherein the protruding strips are semicircular column-shaped.

* * * * *